(12) United States Patent
Chang

(10) Patent No.: US 6,228,708 B1
(45) Date of Patent: May 8, 2001

(54) METHOD OF MANUFACTURING HIGH VOLTAGE MIXED-MODE DEVICE

(75) Inventor: Kuang-Yeh Chang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/209,958

(22) Filed: Dec. 10, 1998

(51) Int. Cl.⁷ .................................. H01L 21/8238
(52) U.S. Cl. .................. 438/253; 438/592; 438/275; 438/296; 438/297
(58) Field of Search .................... 438/253, 275, 438/669, 296, 297, FOR 220, FOR 212, 592

(56) References Cited

U.S. PATENT DOCUMENTS 5,691,217 * 11/1997 Honeycutt .
5,893,737 * 4/1999 Takahi et al. .
5,953,599 * 9/1999 El-Diwany .
6,087,225 * 7/2000 Broner et al. .

* cited by examiner

*Primary Examiner*—George Fourson
*Assistant Examiner*—Joannie A. Garcia

(57) ABSTRACT

A method is described for manufacturing a high voltage mixed-mode device. The method comprises the steps of providing a substrate, wherein the substrate comprises an isolation region, a first active region and a second active region. A first oxide layer is formed on the first active region and the second active region, wherein the thickness of the first oxide layer on the second active region is thicker than that on the first active region. A first conductive layer is formed on the first oxide layer and the isolation region. A patterned second oxide layer is formed on the first conductive layer. A patterned second conductive layer is formed on the second oxide layer and the first conductive layer. The first conductive layer is patterned to form a low-voltage transistor gate on the first active region a high voltage transistor gate on the second active region and a capacitor on the isolation region.

19 Claims, 3 Drawing Sheets ment high voltage and a low voltage respectively. An isolation region 202 is also formed on the substrate 200. A first conductive layer is formed over the substrate 200. In this example the first conductive layer is a doped polysilicon layer 206.

METHOD OF MANUFACTURING HIGH VOLTAGE MIXED-MODE DEVICE

BACKGROUND OF THE INVENTION

1. Field of the Invention

The present invention relates to a method of manufacturing a mixed-mode device. More particularly, the present invention relates to a method of manufacturing a high voltage mixed-mode device.

2. Description of the Related Art

A mixed-mode circuit typically includes a circuit comprising both digital and analog devices on a logic area of a semiconductor chip. The digital devices include inverters, and adders, and the analog devices include amplifiers and analog-to-digital converters. The digital and analog devices further comprise elementary devices such as MOS transistors and capacitors.

FIGS. 1A through 1D are schematic, cross-sectional views of the conventional process for manufacturing a mix-mode device.

First, as shown in FIG. 1A, a substrate 100 is provided. The substrate 100 comprises an active region 101 and a field oxide layer 102. An oxide layer 104 is formed on the active region 101. Using chemical vapor deposition, a conductive layer 106 such as a polysilicon layer is formed on the oxide layer 104 and the field oxide layer 102.

As shown in FIG. 1B, the conductive layer 106 is patterned to form a conductive layer 106a as a bottom electrode of a capacitor on the field oxide layer 102.

As shown in FIG. 1C, the oxide layer 104 is removed. A thermal oxidation step is used to form a gate oxide layer 108 on the substrate 100 and an oxide layer 110 on the surface and the sidewall of the bottom electrode 106a. The oxide layer 110 is used as an inter-polysilicon dielectric layer of the capacitor. A conductive layer 112 such as a polysilicon layer is conformally formed over the substrate 100.

As shown in FIG. 1D, the conductive layer 112 is patterned to form an upper electrode 112a on the field oxide 102 and a conductive layer 112b on the oxide 108 over the active region 101. The conductive layer 112b is a gate of the transistor.

In the prior processes for manufacturing the transistor gate and the capacitor in the mixed-mode device, only a low-voltage transistor gate on the active region and a capacitor on the field oxide layer are formed. The goal of forming a mixed-mode device comprising both high and low voltage transistors, and capacitors is not attainable, especially for the sub-micron fabrication process.

SUMMARY OF THE INVENTION

It is therefore an objective of the invention to provide a method of manufacturing a high voltage mixed-mode device. The capacitor and the gates of the low voltage transistor and the high voltage transistor are formed by the same fabricating step.

To achieve these and other advantages and in accordance with the purpose of the invention, as embodied and broadly described herein, the invention provides a method of manufacturing a high voltage mixed-mode device. A substrate comprising an isolation region, a first active region and a second active region is provided. A first oxide layer is formed on the first active region and the second active region, wherein the thickness of the first oxide layer on the second active region is thicker than that on the first active region. A first conductive layer is formed on the first oxide layer and the isolation region. A patterned second oxide layer is formed on the first conductive layer. A patterned second conductive layer is formed on the second oxide layer and the first conductive layer. The first conductive layer is patterned to form a low-voltage transistor gate on the first active region, a high voltage transistor gate on the second active region and a capacitor on the isolation region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
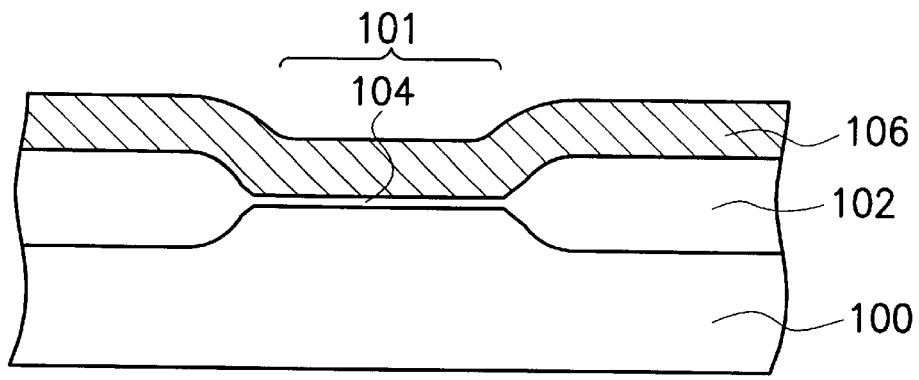
FIGS. 1A through 1D are schematic, cross-sectional views of the conventional process for manufacturing the mix-mode device.
Figure 1B:
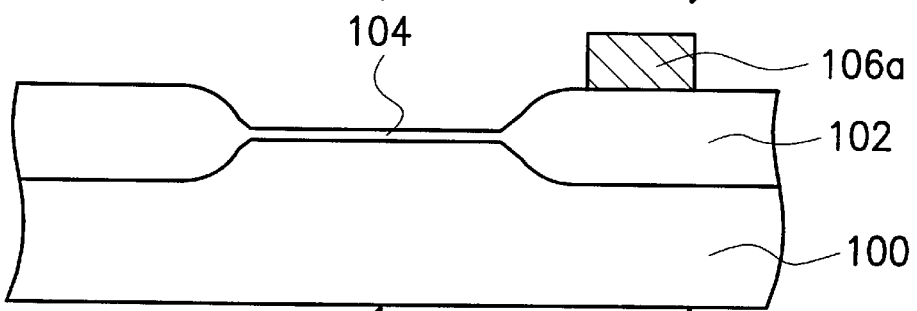
Figure 1C:
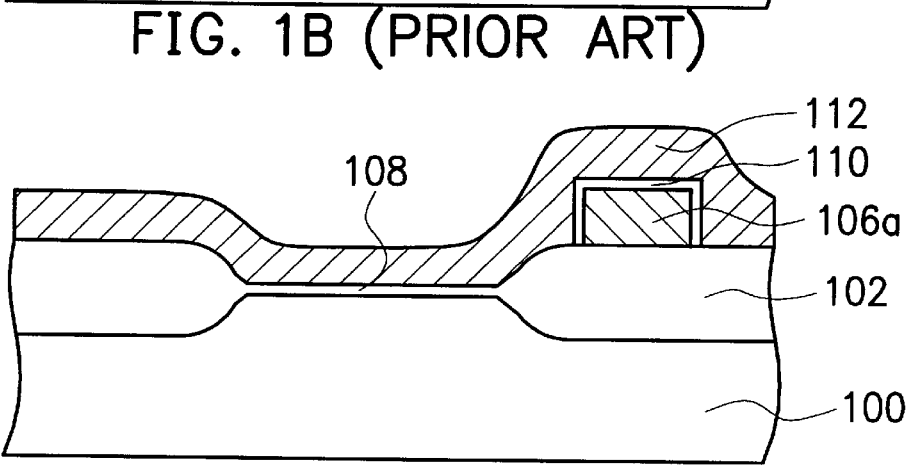
Figure 1D:
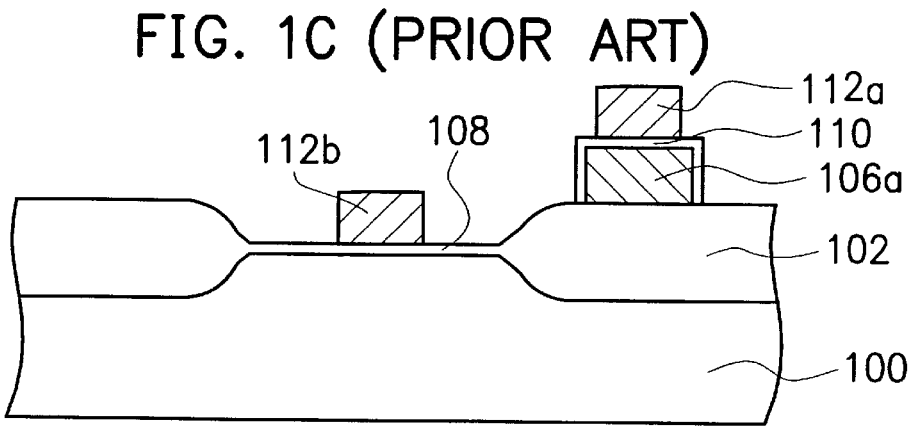

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2H are schematic, cross-sectional views of the process for manufacturing a high voltage mix-mode device in a preferred embodiment according to the invention.

Figure 2A:
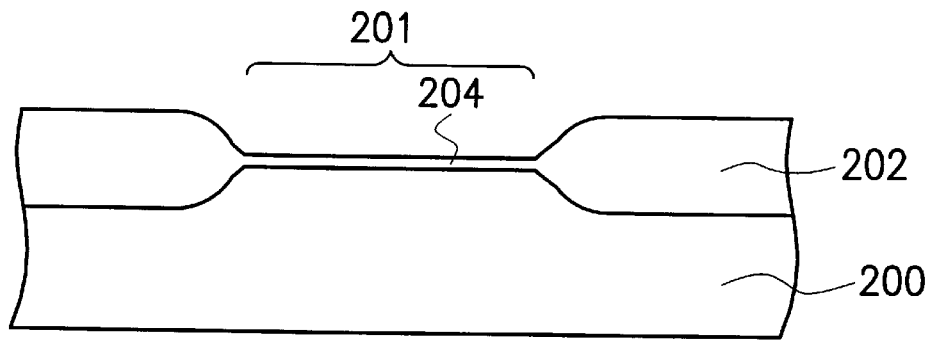
FIGS. 2A through 2H are schematic, cross-sectional views of the process for manufacturing a high voltage mix-mode device in a preferred embodiment according to the invention.

First, as shown in FIG. 2A, a substrate 200 is provided. The substrate 200 comprises an active region 201 and an isolation region 202 such as a field oxide layer. An oxide layer 204 is formed on the active region 201.

Figure 2B:
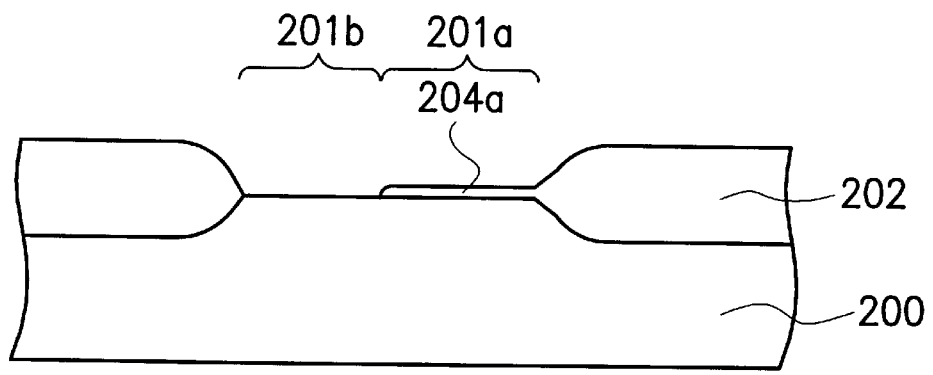

As shown in FIG. 2B, a portion of the oxide layer 204 is removed. The remaining oxide layer is denoted by 204a. The active region 201 is divided into two parts. That is an active region 201b exposed by the oxide layer 204a and an active region 201a covered by the oxide layer 204a. In this example, a patterned photoresist layer (not shown) is formed over the substrate 200 to expose a region predetermined as the region for forming a low voltage transistor thereon. The portion of the oxide layer 204 exposed by the photoresist layer is removed, for example, by wet etching to expose a portion of the substrate 200.

Figure 2C:
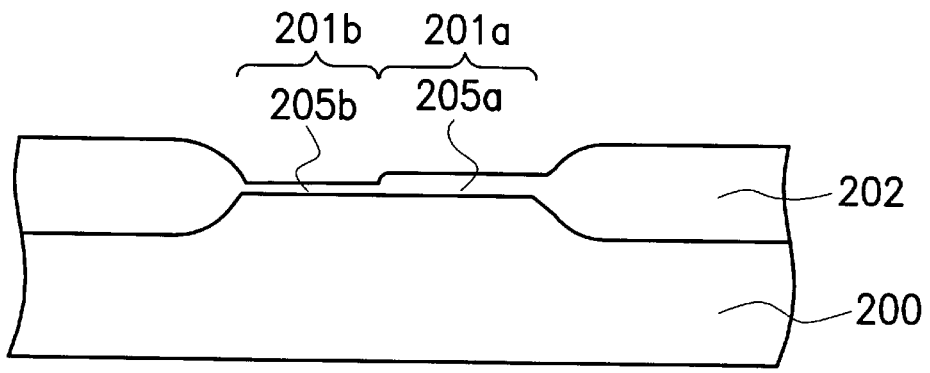

As shown in FIG. 2C, an oxide layer is formed over the substrate 200. In this example, a high voltage transistor gate oxide layer 205a and a low voltage transistor gate oxide layer 205b are respectively formed on the active regions 201a and 201b by thermal oxidation. The gate oxide layers 205a and 205b are formed in the same step. The thickness of the gate oxide layer 205a is thicker than that of the gate oxide layer 205b. Since the gate with different thickness of the gate oxide can sustain different voltage the thickness of the gate oxide layers 205a and 205b are controlled according to the need of the subsequently formed gate to sustain an applying voltage. The thicknesses of the gate oxide layers 205a and 205b are adjusted by controlling the condition of the thermal oxidation.

Figure 2D:
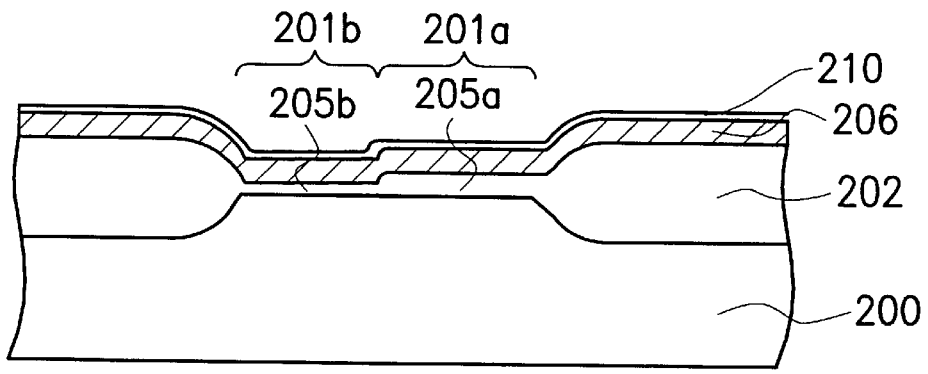

As shown in FIG. 2D, a conductive layer 206 is conformally formed on the gate oxide layer 205a. the gate oxide layer 205b and the isolation region 202. The conductive layer 206 can be a polysilicon layer formed by chemical vapor deposition. An oxide layer 210 is formed on the conductive layer 206. The preferred method of forming the oxide layer 210 is thermal oxidation. The oxide layer 210 is used as an inter-polysilicon dielectric layer between two polysilicon layers in a capacitor formed subsequently on the isolation region 202.

Figure 2E:
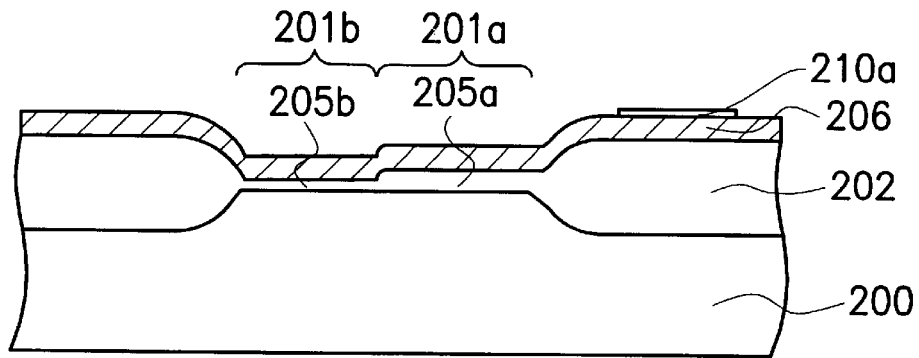

As shown in FIG. 2E, an inter-polysilicon dielectric layer 210a is formed over the isolation region 202 by patterning the oxide layer 210. The method of forming the inter-polysilicon dielectric layer 210a comprises steps of forming a patterned photoresist (not shown) on the oxide layer 210 to cover the region on which the interpolysilicon dielectric layer 210a is subsequently formed, and removing a portion of the oxide layer 210 exposed by the photoresist to form the inter-polysilicon dielectric layer 210a. The method of removing a portion of the oxide layer 210 includes, for example, anisotropic etching.

Figure 2F:
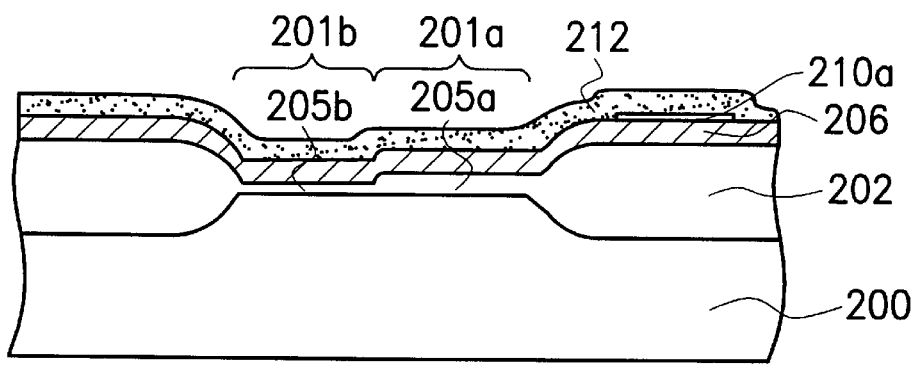

As shown in FIG. 2F a conductive layer 212 is comformally formed on the conductive layer 206 and the inter-polysilicon dielectric layer 210a. The conductive layer 212 includes, for example a tungsten silicide layer formed by chemical vapor deposition.

Figure 2G:
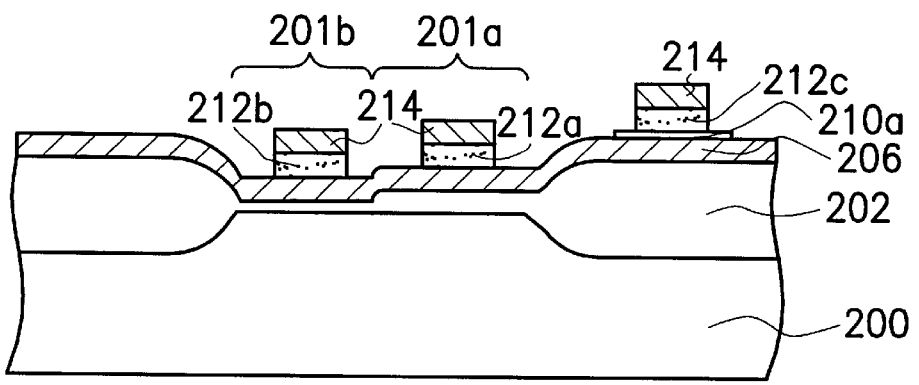

As shown in FIG. 2G, a patterned photoresist 214 is formed on the conductive layer 212. Portions of the conductive layer 212 exposed by the photoresist 214 are removed until the surface of the conductive layer 206 is exposed. The remaining portions of the conductive layer 212 comprise conductive layers 212a, 212b on the active regions respectively and the conductive layer 212c on the inter-polysilicon dielectric layer 210a. The inter-polysilicon dielectric layer 210a may be completely or partly covered by the conductive layer 212c. That is the inter-polysilicon dielectric layer may be partly exposed.

Figure 2H:
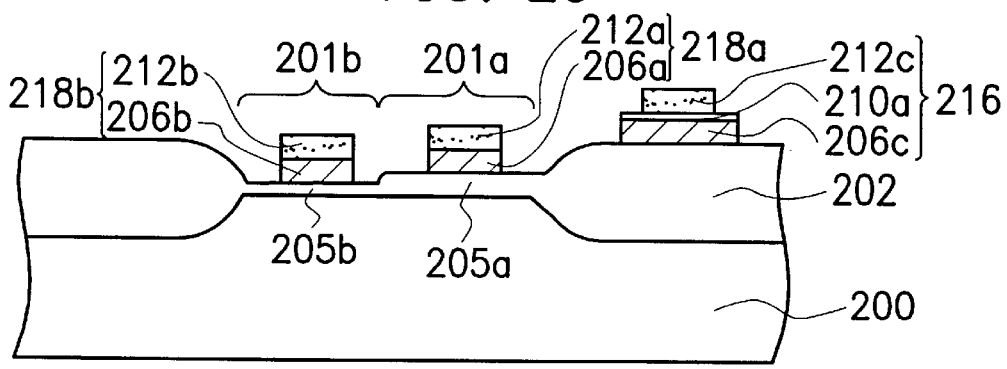

As shown in FIG. 2H, portions of the conductive layer 206 exposed by the photoresist 214 and the inter-polysilicon dielectric layer 210a are removed to form a conductive layer 206c as a bottom electrode of the capacitor on the isolation region 202, a conductive layer 206a on the gate oxide layer 205a and a conductive layer 206b on the gate oxide layer 205b. The method of removing the conductive layer 206 includes, for example, anisotropic etching. Therefore, a capacitor 216 is formed on the isolation region 202, and, gates 218a and 218b are formed on the on the gate oxide layer 205a and the gate oxide layer 205b, respectively. The photoresist 214 is removed. The capacitor 216 includes the conductive layer 206c, the inter-polysilicon dielectric layer 210a and the conductive layer 212c. The gate 218a includes conductive layers 206a and 212a. The gate 218b includes conductive layers 206b and 212b.

Since the inter-polysilicon dielectric layer 210a is used as an etching mask for forming the bottom electrode 206c, the bottom electrode 206c is self-aligned with the inter-polysilicon dielectric layer 210a while performing an etching step to form the bottom electrode 206c. The formation of the conductive layer 212 can decrease the sheet resistance of the low-voltage transistor gate and the high voltage transistor gate and increase the efficiency of the capacitor.

Altogether the present invention includes the following advantages:

1. In the invention, the bottom electrode, the portion of the low-voltage transistor gate and that of the high-voltage transistor are all formed from a single conductive layer.

2. In the invention, the upper electrode, the portion of the low-voltage transistor gate and that of the high-voltage transistor are all formed from a conductive layer such as tungsten silicide and the conductive layer can decrease the sheet resistance of the low-voltage transistor gate and the high voltage transistor and increase the efficiency of the capacitor.

3. In the invention, the inter-polysilicon dielectric layer is used as an etching mask for forming the bottom electrode; the bottom electrode can self-align with the inter-polysilicon dielectric layer during performance of an etching step to form the bottom electrode.

4. The present invention and the conventional process techniques are compatible; thus the present invention is suitable for use by manufacturers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a high voltage mixed-mode device, comprising the steps of:

providing a substrate wherein the substrate comprises an isolation region, an active region and a first oxide layer formed on the active region;

removing a portion of the first oxide layer to divide the active region into a first and second active region, wherein the second active region is covered by the first oxide layer;

forming a second oxide layer on the first active region and the first oxide layer on the second active region;

forming a first conductive layer on the second oxide layer and the isolation region;

forming a patterned third oxide layer on the first conductive layer over the isolation region;

forming a patterned second conductive layer on the third oxide layer and the first conductive layer over the first and the second active regions; and removing the first conductive layer until the second oxide layer on the first and the second active regions and the isolation region are exposed.

2. The method of claim 1, wherein the isolation region includes a field oxide layer.

3. The method of claim 1 wherein the step of removing a portion of the first oxide layer includes wet etching.

4. The method of claim 1, wherein the first conductive layer includes a polysilicon layer.

5. The method of claim 1, wherein the step of forming the patterned third oxide layer further comprises thermal oxidation.

6. The method of claim 1, wherein the step of forming the patterned third oxide layer further comprises anisotropic etching.

7. The method of claim 1, wherein the second conductive layer includes a tungsten silicide layer.

8. The method of claim 1, wherein the step of forming the patterned second conductive layer further comprises anisotropic etching.

9. The method of claim 1, wherein the method step of patterning the first conductive layer includes anisotropic etching.

10. A method of manufacturing a high voltage mixed-mode device, comprising the steps of:

provicing a substrate, wherein the substrate comprises an isolation region, a first active region and a second active region;

forming a first oxide layer on the first active region and the second active region, wherein the thickness of the first oxide layer on the second active region is thicker than that on the first active region;

forming a first conductive layer on the first oxide layer and the isolation region;

forming a patterned second oxide layer on the first conductive layer;

forming a patterned second conductive layer on the second oxide layer and the first conductive layer; and patterning the first conductive layer to form a low-voltage transistor gate on the first active region, a high-voltage transistor gate on the second active region and a capacitor on the isolation region.

11. The method of claim 10, wherein the isolation region includes a field oxide layer.

12. The method of claim 10, wherein the step of forming the first oxide layer further comprises the steps of:

forming an oxide layer on the first active region and the second oxide region;

removing a portion of the oxide layer on the first active region to expose a portion of the substrate; and performing a thermal oxidation step to form the first oxide layer on the first active region and the second oxide region.

13. The method of claim 12, wherein the method of removing a portion of the oxide layer on the first active region includes wet etching.

14. The method of claim 10, wherein the first conductive layer includes a polysilicon layer.

15. The method of claim 10, wherein the step of forming the patterned second oxide layer further comprises thermal oxidation.

16. The method of claim 10, wherein the step of forming the patterned second oxide layer further comprises anisotropic etching.

17. The method of claim 10, wherein the second conductive layer includes a tungsten silicide layer.

18. The method of claim 10, wherein the step of forming the patterned second conductive layer further comprises anisotropic etching.

19. The method of claim 10, wherein the step of patterning the first conductive layer includes anisotropic etching.

* * * * *